United States Patent
Takahashi et al.

(10) Patent No.: US 6,765,299 B2
(45) Date of Patent: Jul. 20, 2004

(54) SEMICONDUCTOR DEVICE AND THE METHOD FOR MANUFACTURING THE SAME

(75) Inventors: Yoshikazu Takahashi, Tokyo (JP); Takashi Ohsumi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/797,907

(22) Filed: Mar. 5, 2001

(65) Prior Publication Data

US 2001/0038151 A1 Nov. 8, 2001

(30) Foreign Application Priority Data

Mar. 9, 2000 (JP) ........................................ 2000-071027

(51) Int. Cl.[7] ........................... H01L 23/52; H01L 23/48
(52) U.S. Cl. ...................... 257/777; 257/688; 257/778; 257/774
(58) Field of Search ............................... 257/777, 688, 257/778, 774; 438/637, 108

(56) References Cited

U.S. PATENT DOCUMENTS 6,201,302 B1 * 3/2001 Tzu ........................... 257/686
6,204,562 B1 * 3/2001 Ho et al. ..................... 257/723
6,236,115 B1 * 5/2001 Gaynes et al. ............... 257/686
6,348,728 B1 * 2/2002 Aiba et al. ................... 257/678

FOREIGN PATENT DOCUMENTS

| JP | 61-259533 | 11/1986 |
|----|-----------|---------|
| JP | 5-63137 | 3/1993 |
| JP | 10-84076 | 3/1998 |
| JP | 11-288977 | 10/1999 |
| JP | 2001-60658 | 3/2001 |
| JP | 2003-504849 | 2/2003 |

* cited by examiner

Primary Examiner—Amir Zarabian
Assistant Examiner—Kusha Rose
(74) Attorney, Agent, or Firm—Volentine Francos, PLLC

(57) ABSTRACT

A semiconductor device includes a first semiconductor chip having a plurality of pads, a second semiconductor chip having a plurality of pads, the second semiconductor chip being fixed over a main surface of the first semiconductor chip, an insulating layer formed between the first semiconductor chip and the second semiconductor chip a plurality of conductive posts formed over the main surface of the first semiconductor chip and a main surface of the second semiconductor chip, the plurality of conductive posts being electrically connected to the plurality of pads on the first semiconductor chip and the plurality of pads on the second semiconductor chip and a resin covering the main surfaces of the first and second semiconductor chips, the resin partially covering the plurality of conductive posts.

18 Claims, 14 Drawing Sheets

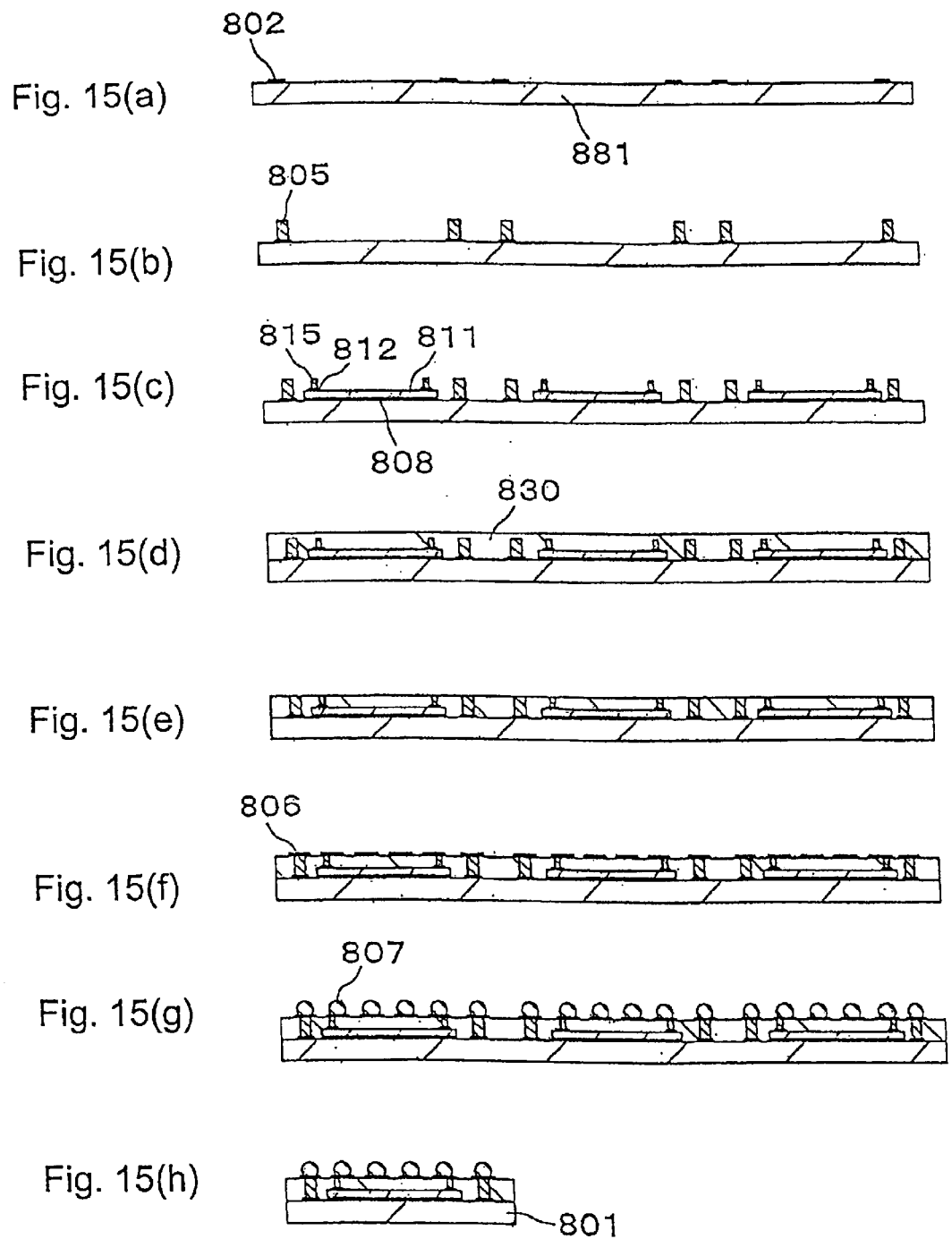

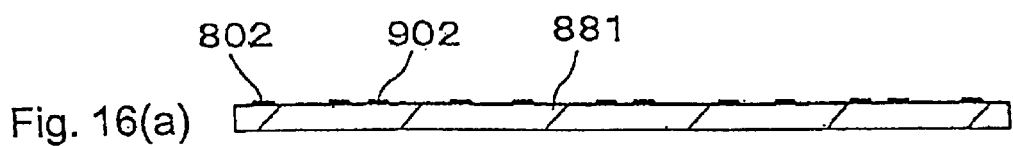
Fig. 16(a)
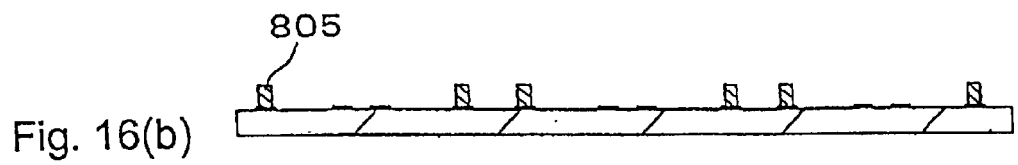
Fig. 16(b)
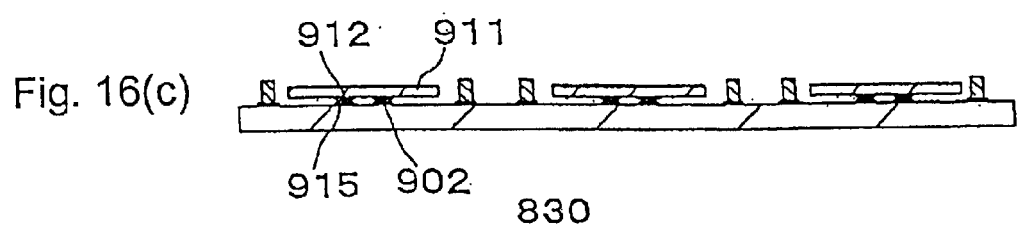
Fig. 16(c)
Fig. 16(d)
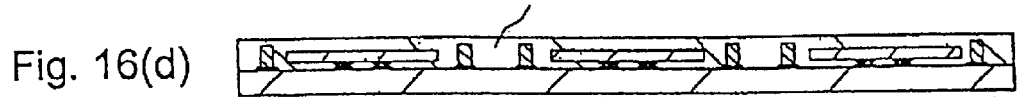
Fig. 16(e)
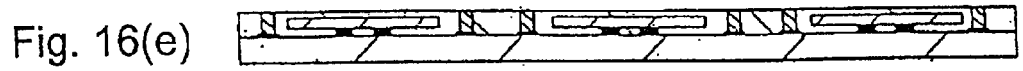
Fig. 16(f)
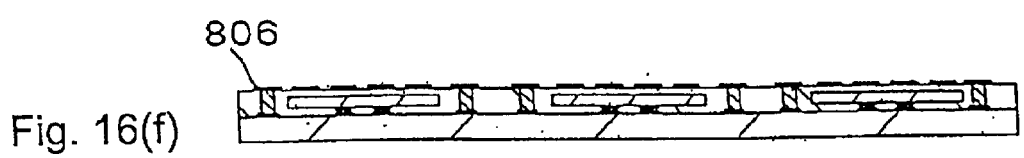
Fig. 16(g)
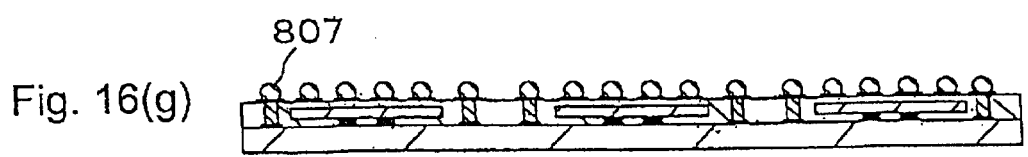
Fig. 16(h)
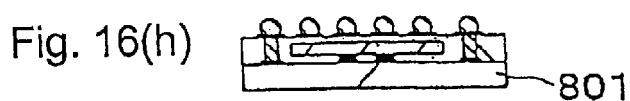

SEMICONDUCTOR DEVICE AND THE METHOD FOR MANUFACTURING THE SAME

BACKGROUND OF THE INVENTION

1. Field of the Invention

The present invention relates to a semiconductor device, and to the method for manufacturing the same. In particular, this invention relates to a chip size package, which has a plurality of semiconductor chips.

2. Description of the Related Art

Electronic appliances are becoming smaller and lighter as a result of developments in the semiconductor industry and customer' demands. One of the technologies for providing compact packages is called Chip Size Package (CSP). A CSP has approximately the same size as a semiconductor chip. And one of the technologies for providing integrated circuitry for use in such appliances is called Multi-Chip Packaging (MCP) or called Multi-Chip Module (MCM).

It is difficult for a CSP without an intermediate substrate, which is called an interposer, to include a plurality of chips. However, a CSP with an intermediate substrate is bigger and more expensive than the CSP without an interposer.

SUMMARY OF THE INVENTION

A semiconductor device includes a first semiconductor chip having a plurality of pads, a second semiconductor chip having a plurality of pads, the second semiconductor chip being fixed over a main surface of the first semiconductor chip, an insulating layer formed between the first semiconductor chip and the second semiconductor chip a plurality of conductive posts formed over the main surface of the first semiconductor chip and a main surface of the second semiconductor chip, the plurality of conductive posts being electrically connected to the plurality of pads on the first semiconductor chip and the plurality of pads on the second semiconductor chip and a resin covering the main surfaces of the first and second semiconductor chips, the resin partially covering the plurality of conductive posts.

BRIEF DESCRIPTION OF THE DRAWINGS

While the specification concludes with claims particularly pointing out and distinctly claiming the subject matter that is regarded as the invention, the invention, along with the objects, features, and advantages thereof, will be better understood from the following description taken in conjunction with the attached drawings, in which:

FIG. 15 shows a method for manufacturing the semiconductor device of the first embodiment.

FIG. 16 shows a method for manufacturing the semiconductor device of the fifth embodiment.

DETAILED DESCRIPTION OF THE PREFERRED EMBODIMENTS

Figure 1:
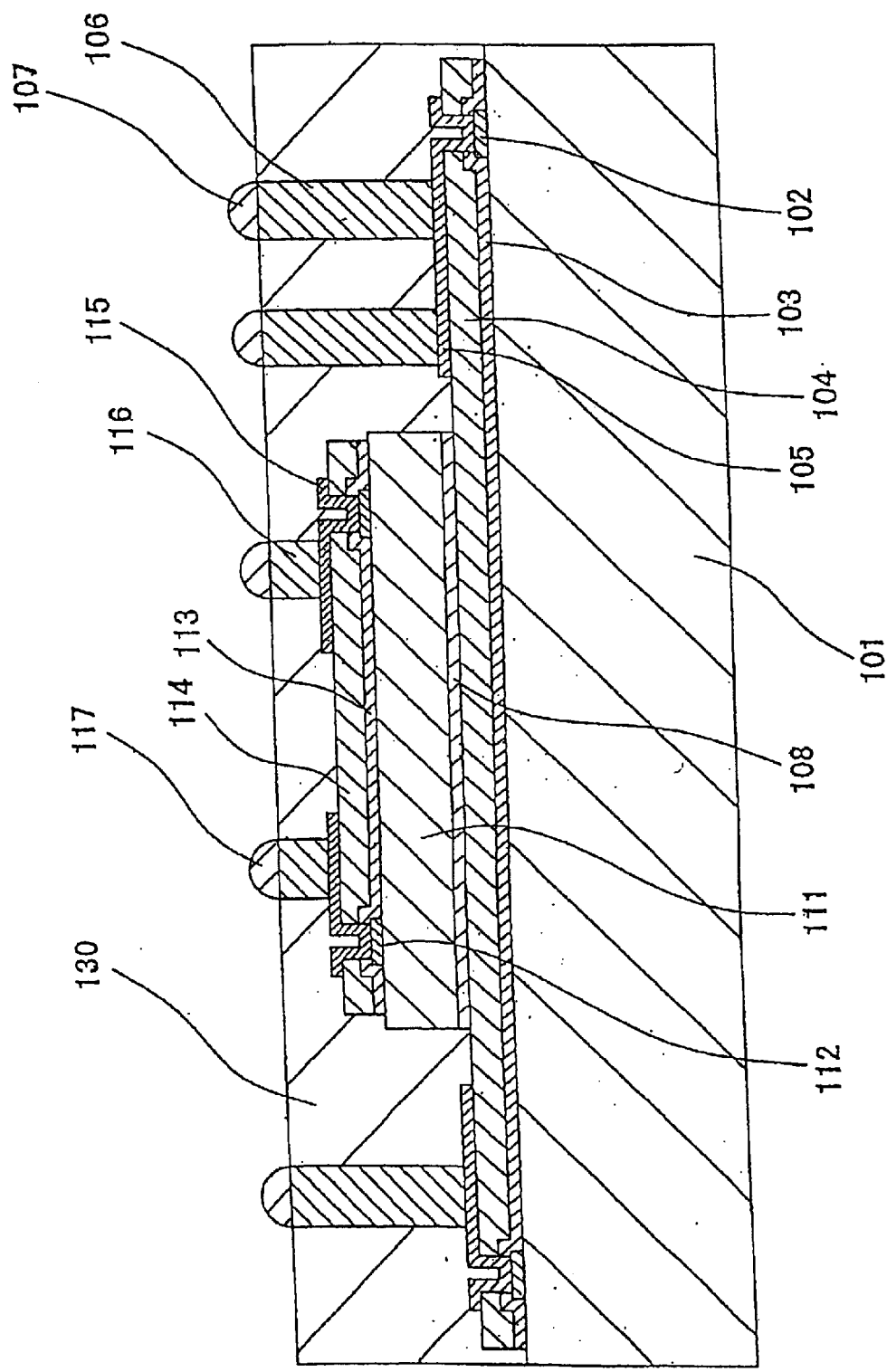
FIG. 1 shows a cross sectional view of a semiconductor device of a first embodiment of the invention.

The preferred embodiments are described below using diagrams. The same reference numerals are applied to the same elements in each embodiment and diagram.

FIG. 1 shows a cross sectional view of the semiconductor device of the first embodiment. The second semiconductor chip 111 is fixed over the first semiconductor chip 101, and molded with resin 130. The chip size of the first semiconductor chip 101, which is a supporting substrate, is approximately the same as the size of the package. Each semiconductor chip has a main surface and a back surface, circuits of the semiconductor chips are formed on the main surfaces.

A plurality of pads 102 and a first protecting layer 103 are formed on the main surface of the first semiconductor chip 101. A second protecting layer 104 is formed over the main surface of the semiconductor chip 101. The pads 102 are connected to an inner circuit of the semiconductor chip 101. The protecting layers 103 and 104 protect the main surface of the semiconductor chip 101, and have a plurality of holes at the portion corresponding to the pads 102. Interconnections 105 connected to the pads 102 are formed on the protecting layer 104. Conductive posts 106 connected to the interconnections 105 are formed on the interconnections. Connecting electrodes 107 (for example, solder bump) are formed on the conductive posts 106. The pads 102 are electrically connected to an outer printed board via interconnections 105, conductive posts 106, and connecting electrodes 107.

The second semiconductor chip 111 is fixed over the protecting layer 104 by die bonding material 108. The second semiconductor chip 111 is a different chip from the first semiconductor chip 101, and is smaller than the first semiconductor chip 101. The thickness of the second semiconductor chip 111 is thin enough for packaging in the package.

A plurality of pads 112 and a third protecting layer 113 are formed on the main surface of the second semiconductor chip 111. A fourth protecting layer 114 is formed on the third protecting layer 113.

The pads 112 are connected to an inner circuit of the second semiconductor chip 111. The protecting layers 113 and 114 protect the main surface of the second semiconductor chip 111, and have a plurality of holes at the portion corresponding to the pads 112. Interconnections 115 connected to the pads are formed on the protecting layer 114. Conductive posts 116 connected to the interconnections are formed on the interconnections. Connecting electrodes 117

(for example, solder bump) are formed on the conductive posts 116. The pads 112 are electrically connected to a printed board via interconnections 115, conductive posts 116, and connecting electrodes 117. The molding resin 130 covers the structure including the conductive posts 106, whereby the connecting electrodes 107 are exposed from the molding resin 130.

The protecting layers 103 and 113 are a silicon oxide layer or a silicon nitride layer. The protect layers 104 and 114 is a kind of high polymer layer such as polyimide. As an alternative a single layer can be used to protect the main surface of the first semiconductor device. However, a dual layer is more protective against an influence of die bonding and stress during mounting this package. An insulating layer is used as the protecting layer to avoid the main surface of the first semiconductor chip from being electrically connected to the back surface of the second semiconductor chip.

Interconnections 105 and 115 are dual layer also. Interconnections 105 and 115 include a titanium layer and a copper layer. A titanium layer is formed to protect the pad and to raise adhesion to the protecting layers. A copper layer is formed to decrease resistance of the interconnection. As an alternative a single layer can be used as an interconnection. Other combinations of interconnections are chromium-copper, chromium-gold, nickel-copper, nickel-gold, titanium/tungsten-copper, titanium/tungsten-copper, and so on.

At least, the surfaces of the conductive posts 106 and 116 are exposed to the outside of the package for electrically connecting. For example, conductive posts 106 and 116 are made of copper, gold, or aluminum.

Only one semiconductor chip 111 is shown in FIG. 1, except for the first semiconductor chip 101 that is a supporting substrate. However, a plurality of chips can be fixed over the first semiconductor chip 101 if there is a necessity. Each of chip can be selected for a purpose. Therefore, there may be a variety of combinations of chips, for example, a memory chip and a logic chip, a memory chip and a memory chip, or a logic chip and a logic chip.

It is thus possible to include a plurality of chips without an intermediate substrate, which is called an interposer, in this embodiment. A size of the package is approximately the same as the size of the biggest semiconductor chip included in the package. Therefore, it is possible to provide an improved integrated circuitry. A plurality of semiconductor chips is included in a package in this embodiment. Therefore, each semiconductor chip is protected from moisture. The semiconductor device of this embodiment is more reliable about moisture proof than the each semiconductor chip is molded separately. A mounting process of a semiconductor device on a printed circuit board is simplified according to this embodiment.

Figure 8:
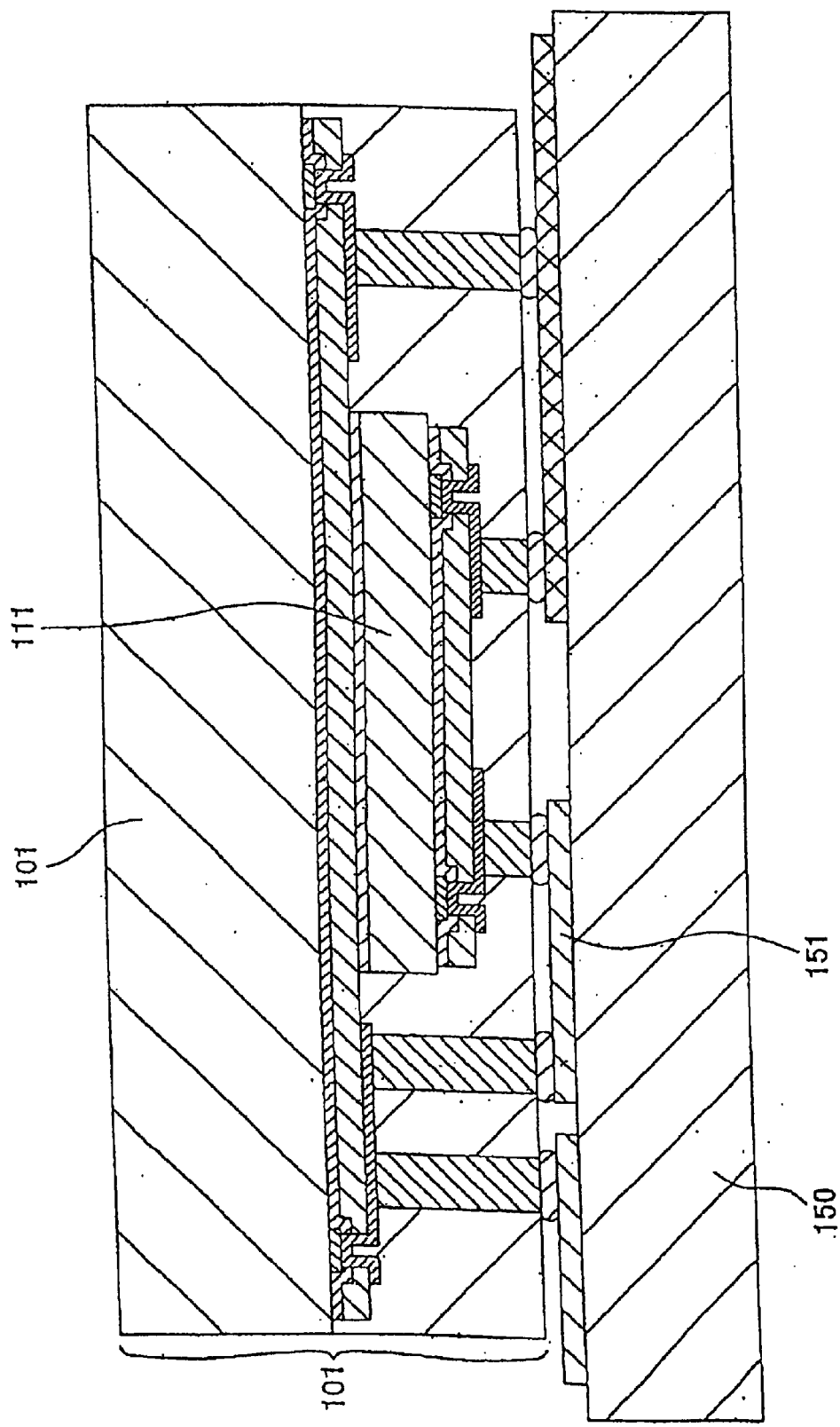
FIG. 8 is a cross sectional view which shows a state that a semiconductor device of the first embodiment is mounted on a printed circuit board.

FIG. 8 is a cross sectional view which shows a state that the semiconductor device of the first embodiment is mounted on a printed circuit board 150. The first semiconductor chip 101 and the second semiconductor chip 111 are electrically connected to the interconnections 151 formed on the printed circuit board 150.

Figure 9A:
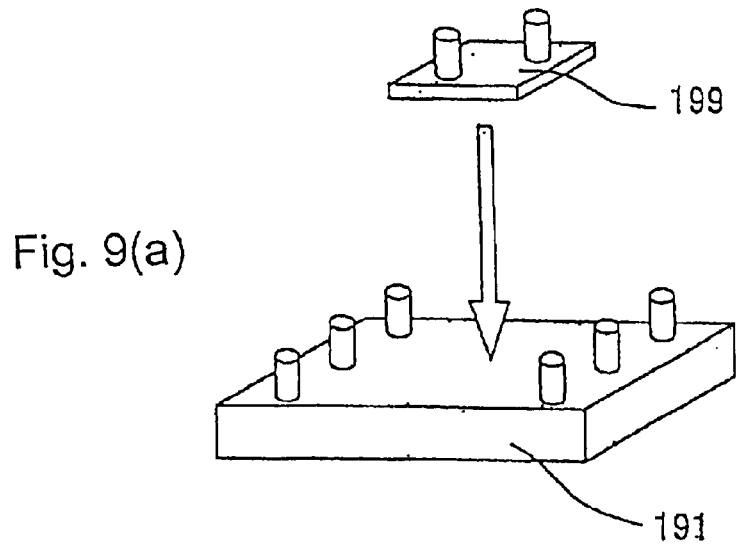
FIGS. 9(a) and 9(b) show a method for fixing the semiconductor chip on the semiconductor chip.
Figure 9B:
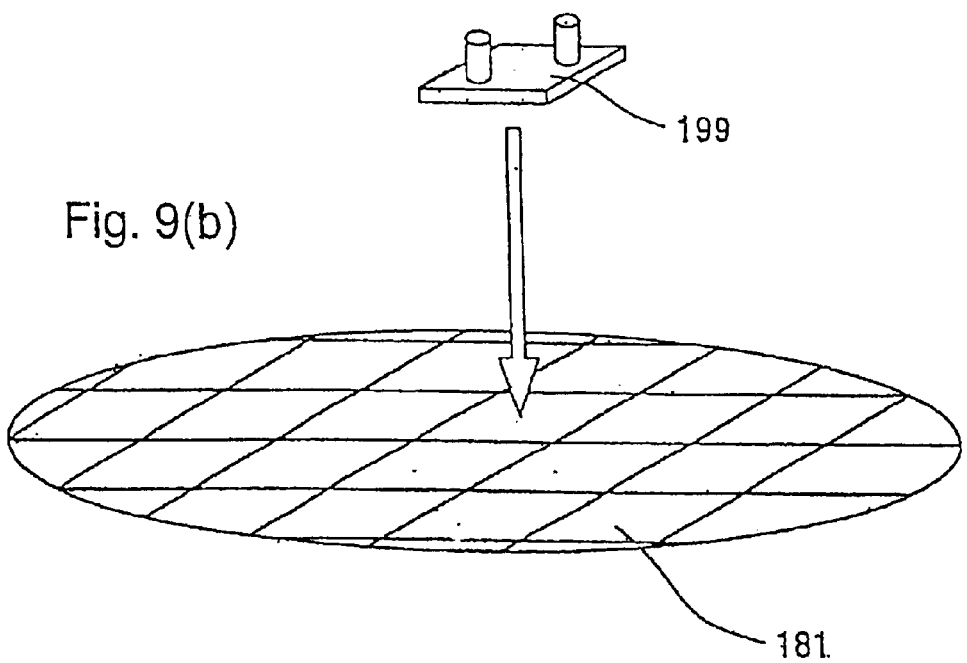

FIGS. 9(*a*) and 9(*b*) show a method for fixing the semiconductor chip 111 on the semiconductor chip 101. Pads 102, the protecting layers 103, 104, the interconnections 105, and the conductive post 106 is formed over the semiconductor chip 101 before fixing the semiconductor chip 111. Pads 112, the protecting layers 113, 114, the interconnections 115, and the conductive posts 116 are formed over the second semiconductor chip 111 before fixing the semiconductor chip 111. The first semiconductor chip 101 does not have to be diced and separated into individual semiconductor chips. A semiconductor wafer before dicing may be used.

If the first semiconductor chip 101 is separated into individual chips, the second semiconductor device 199 is fixed over the separated first semiconductor chip 191 as shown in FIG. 9(*a*). If the first semiconductor chip 101 is not separated into individual chips, the second semiconductor device 199 is fixed over the semiconductor wafer 181 as shown in FIG. 9(*b*).

A semiconductor package has to be as thin as possible and it is desirable that the second semiconductor chip 111 is parallel to the first semiconductor chip 101. Therefore, it is desirable to use the die bonding material that is thin and flat. Some materials such as silver paste, liquid polyimide, or an adhesive tape are used as a die bonding material.

If the first semiconductor chip 101 is separated into individual chips before fixing to the second semiconductor chip 111, there is an advantage that scratches on each semiconductor chip is reduced. If the first semiconductor chip 101 is not separated into individual chips before fixing to the second semiconductor chip 111, there is an advantage that manufacturing of the semiconductor device is simplified. That is because the processes, such as molding resin, can be performed on wafer.

Figure 10:
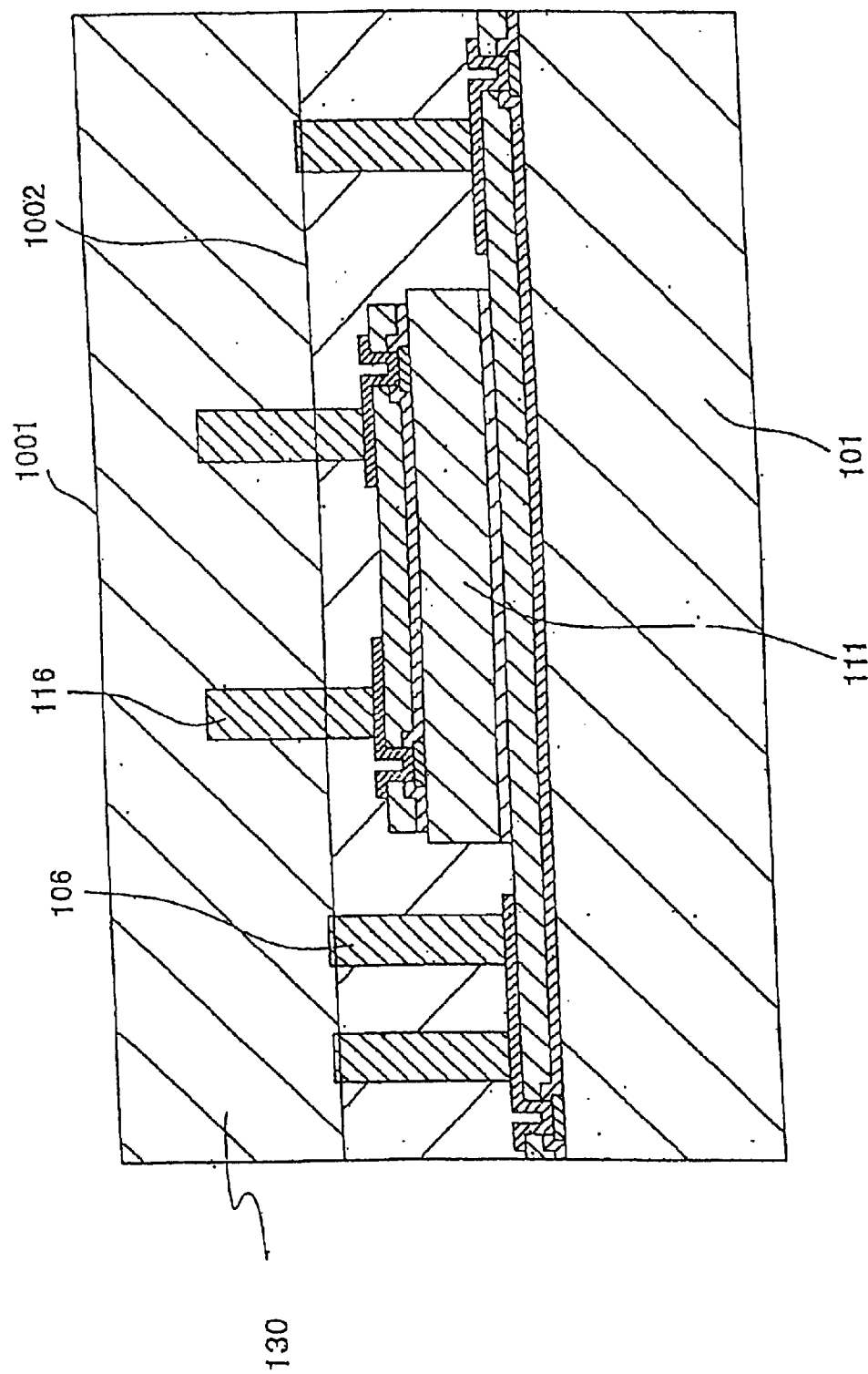
FIG. 10 is a cross sectional view which shows a thickness of polished resin.

FIG. 10 shows a method for exposing a surface of the conductive posts 106, 116. The conductive posts 106, 116 are formed by using electroplating or by fixing a micro conductive post on each chip. It is difficult to control the height of the conductive post during the above described formation. Therefore, the top surfaces of the conducting posts 106 and 116 are not at the same level after the fixing of the second semiconductor device as shown in FIG. 10.

The resin 130 is molded to cover all surfaces of the conductive layer 106 and 116. The top surface of the molded resin is shown as 1001 in FIG. 10. Then the molded resin 130 is polished until the top surface of the conductive posts 106 are exposed. The level that the polishing is finished is shown as 1002 in FIG. 10. The conductive posts 106 and 116 are also polished in this polishing. Therefore, the top surfaces of the conductive posts 106 and 116 are exposed at the same level of the package. An etching technique can be used instead of polishing in this embodiment. A molding resin 130 and conductive posts 106, 116 are polished or etched in the same process in this embodiment. Therefore, it is easy to expose the top surfaces of the conductive posts 106 and 116.

A method for testing the semiconductor device having a plurality of semiconductor chips of an embodiment of the invention is described below. There are two ways for testing the semiconductor device, depending on the method for manufacturing the semiconductor device. One case is that each semiconductor device is separated before the test, and the other is that each semiconductor device is not separated before the test. Individual tests are needed in the first case and a wafer level test is needed in the second case.

An individual test is a reliable test to select a non-defective product and defective product. A wafer level test does not need any optional parts or socket to hold an individual device.

In both cases, the semiconductor device of this invention is tested after the semiconductor chips are combined in addition to the test of each semiconductor chip before combining. Therefore, the whole function of the semiconductor device having a plurality of semiconductor chips can be tested, and confirmed.

Figure 2:
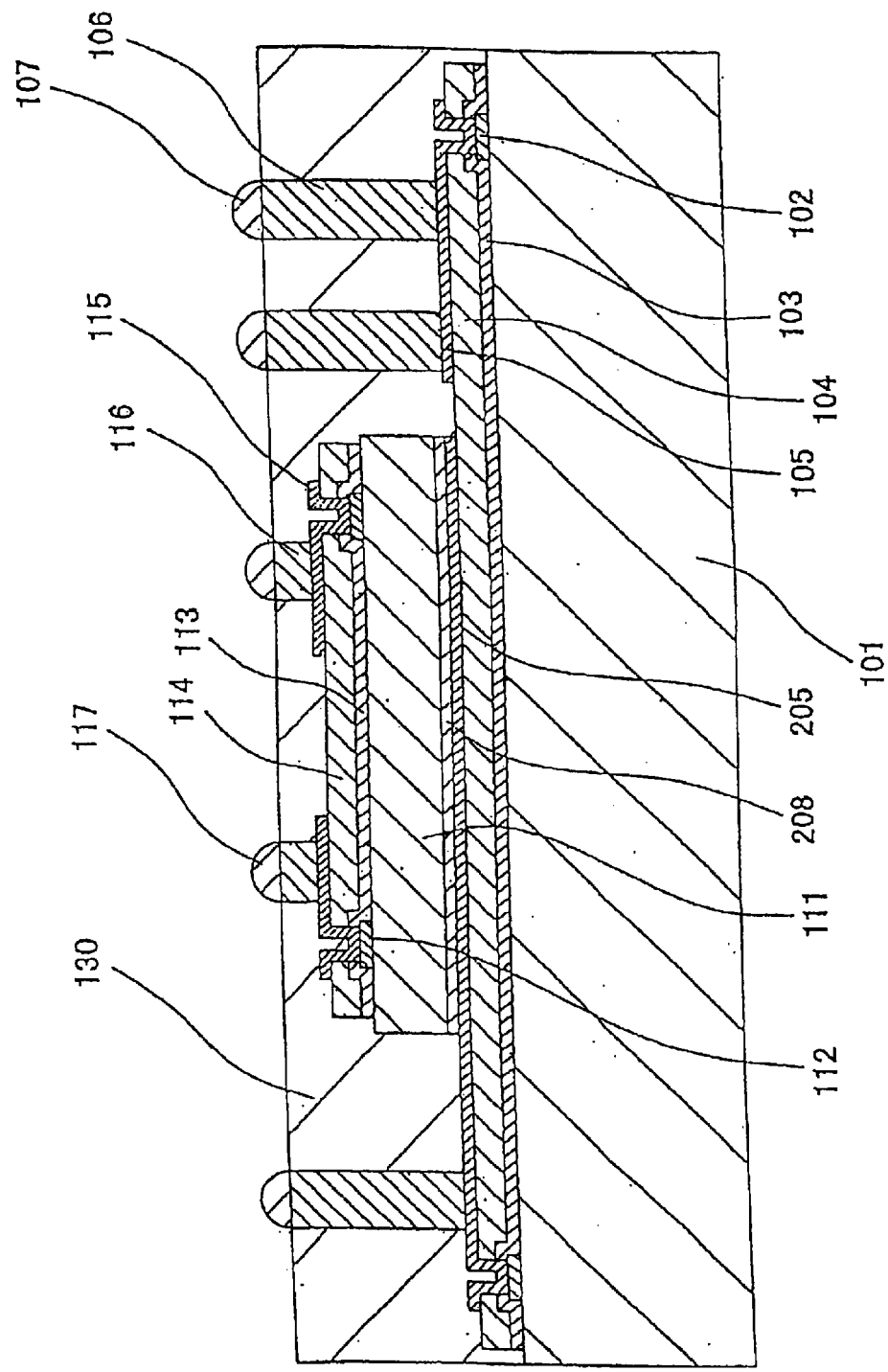
FIG. 2 shows a cross sectional view of a semiconductor device of a second embodiment of the invention.

FIG. 2 shows a cross sectional view of the semiconductor device of the second embodiment. This semiconductor device further includes a conductive layer 205 in addition to all elements of the first embodiment. A die bonding material 208 is a conductive material in this embodiment. The conductive layer 205 is extended to the region located under the second semiconductor device 111. The conductive layer 205 is connected to at least one of the conductive posts 106.

Therefore, the bottom surface of the second semiconductor device, which is a substrate of the circuit formed on the main surface of the second semiconductor chip, is electrically connected to a predetermined potential via the die bonding material 208, the conductive layer 205, a conductive post 106, and an electrode 107. In case that one of the pads 102 has to have a predetermined level such as ground potential applied thereto, it is possible to share the conductive layer 205 and conductive post 106 as shown in FIG. 2.

It is thus possible to hold the potential of the bottom surface (substrate) of the second semiconductor chip at a predetermined level according to this embodiment, in addition to the effects of the first embodiment Therefore, the stable operation of the semiconductor device is achieved.

Figure 3:
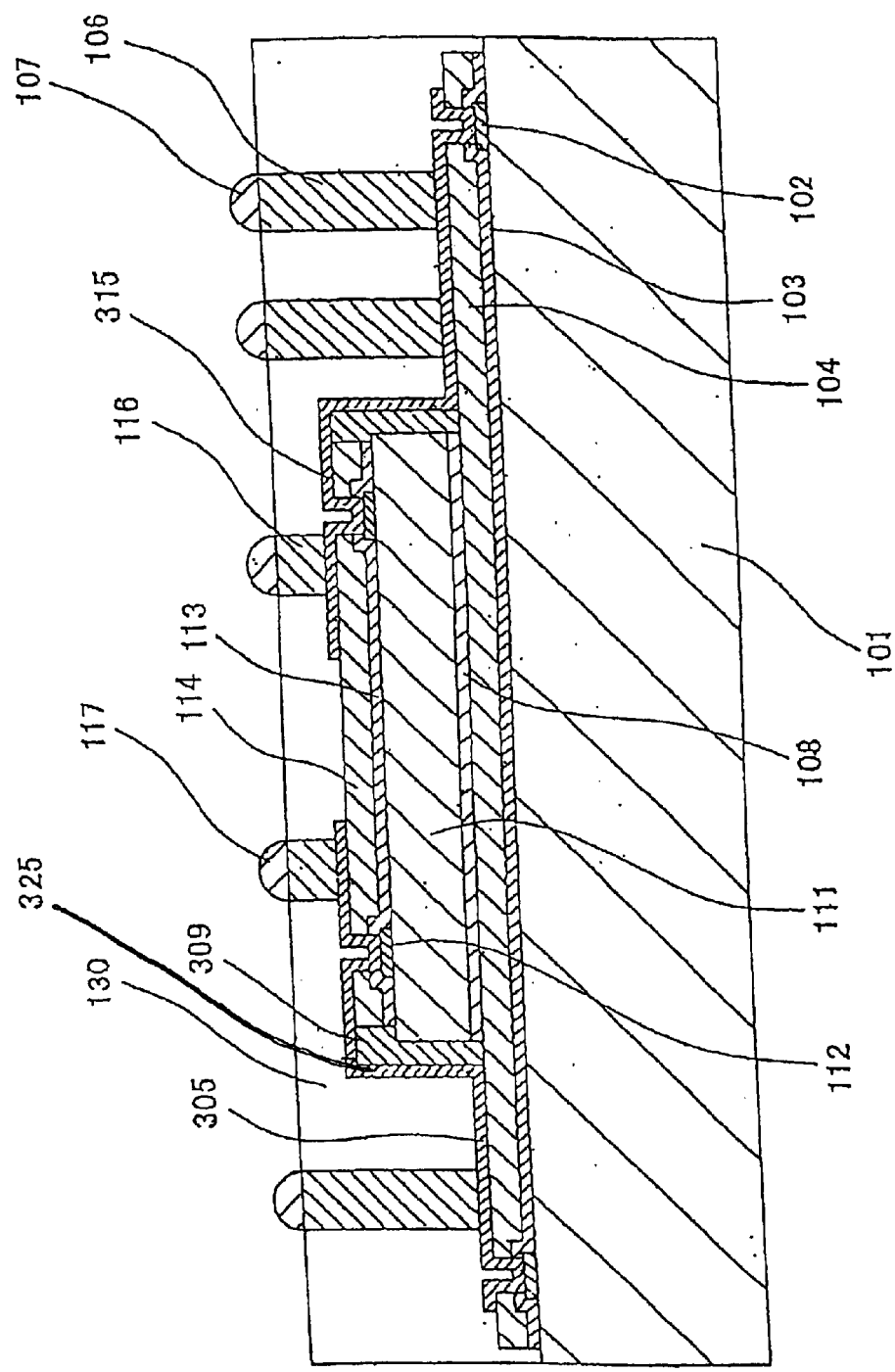
FIG. 3 shows a cross sectional view of a semiconductor device of a third embodiment of the invention.

FIG. 3 shows a cross sectional view of the semiconductor device of the third embodiment. This semiconductor device in the third embodiment has interconnections 305 and 315 instead of the interconnections 105 and 115 in the first embodiment, and further includes an insulating sidewall structure 309 on a side surface of the second semiconductor chip 111. The interconnection 305 is electrically connected to the interconnection 315 via a conductive layer 325 formed on the insulating sidewall structure 309. The insulating side wall structure 309 and the conductive layer 325 are formed after fixing the second semiconductor chip 111. Thus, the first semiconductor chip 101 is electrically connected to the second semiconductor chip 111 via interconnections 305 and 315.

In case that a plurality of second semiconductor chips are fixed on the first semiconductor chip, the insulating sidewall structure and the conductive layer on the insulating sidewall structure are formed on each second semiconductor chip 111, that is fixed on the first semiconductor chip 101. Therefore, a plurality of semiconductor chips are electrically connected to each other. The conductive post 116 and the electrode 117 are formed according to necessity.

A plurality of semiconductor chips are thus electrically connected to each other in a package in this embodiment. Therefore, there is no need to form a connecting pattern, which electrically connects the first semiconductor chip to the other semiconductor chip, on a printed circuit board. The length of an interconnection between semiconductor chips is short in this embodiment. Therefore, high speed operation of the semiconductor device is obtained.

Figure 4:
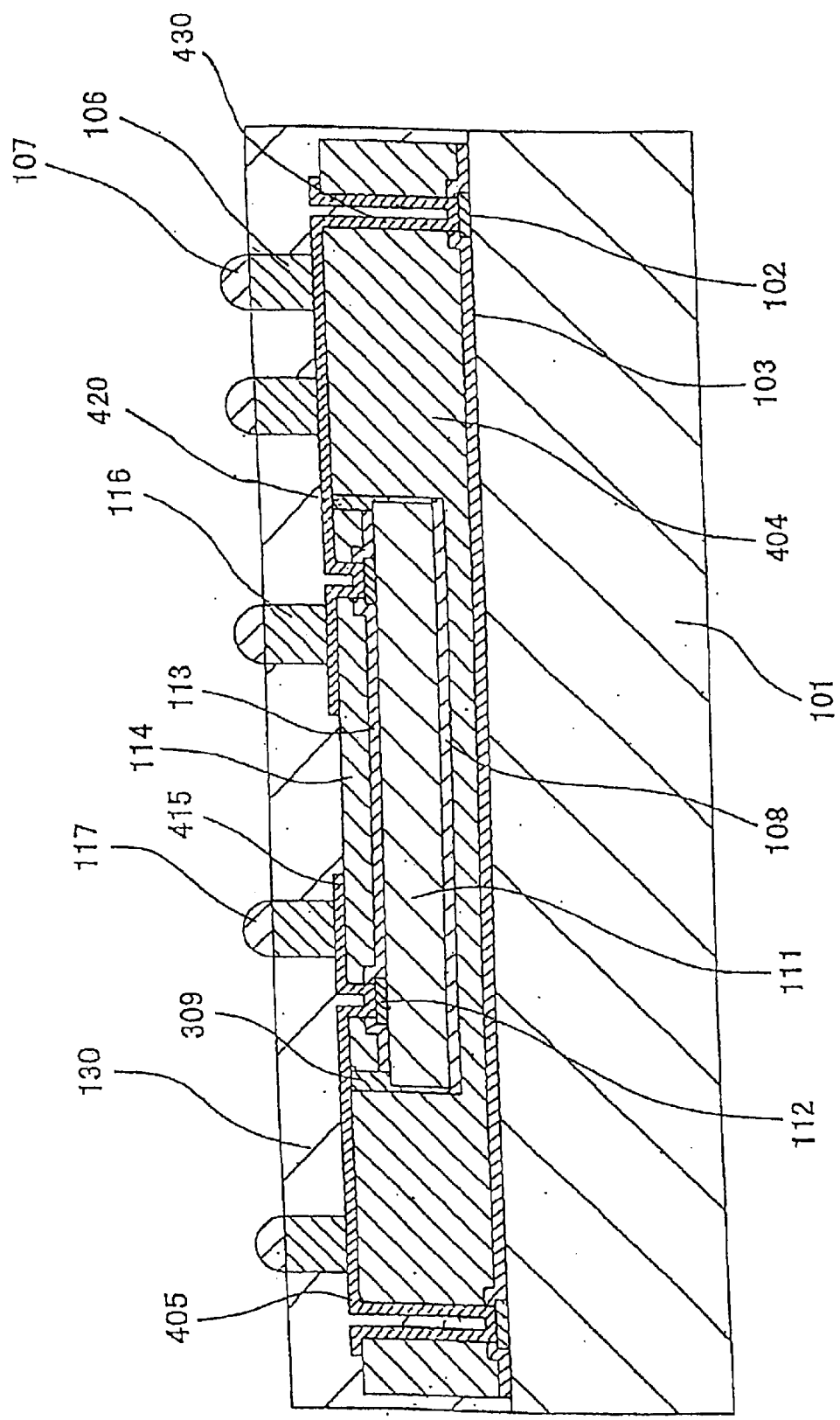
FIG. 4 shows a cross sectional view of a semiconductor device of a fourth embodiment of the invention.

FIG. 4 shows a cross sectional view of the semiconductor device of the fourth embodiment. The protecting layer 404 in this embodiment is thicker than the thickness of the protecting layer 104 in the first embodiment, and the thickness of the second semiconductor device 111. This protecting layer 404 has a concave portion 420 and a plurality of holes 430. The size of a concave portion 420 is about the same as the second semiconductor chip 111, and formed at the portion that the second semiconductor device is fixed. The holes 430 are formed at the portion located over the pads 102 on the first semiconductor chip 101.

The second semiconductor chip 111 is fixed in the concave portion 420. Inter connections 405 are connected to the pads 102, and to interconnections 415 over the second semiconductor devices. The protecting layer 404 is a kind of high polymer layer such as polyimide.

According to this embodiment, it is possible to form interconnections 405 and 415 in the same process on a wafer before dicing. The protecting layer 404 is formed over a semiconductor wafer. Concave portions and holes are formed in the protecting layer 404 for each semiconductor chip. An interconnection layer is formed on the semiconductor wafer after fixing the second semiconductor chips. A patterning is performed to make the interconnection layer have a predetermined pattern, which corresponds to interconnections 405 and 415.

The top surface of the semiconductor device before molding of resin is more even than that of the other embodiments because of the protecting layer 404. Therefore, the molding of resin 130 becomes more stable.

As described above, the process to form interconnections between semiconductor chips is simplified, and the process for molding resin is stable in this embodiment. A plurality of semiconductor chips are electrically connected each other in a package.

Figure 5:
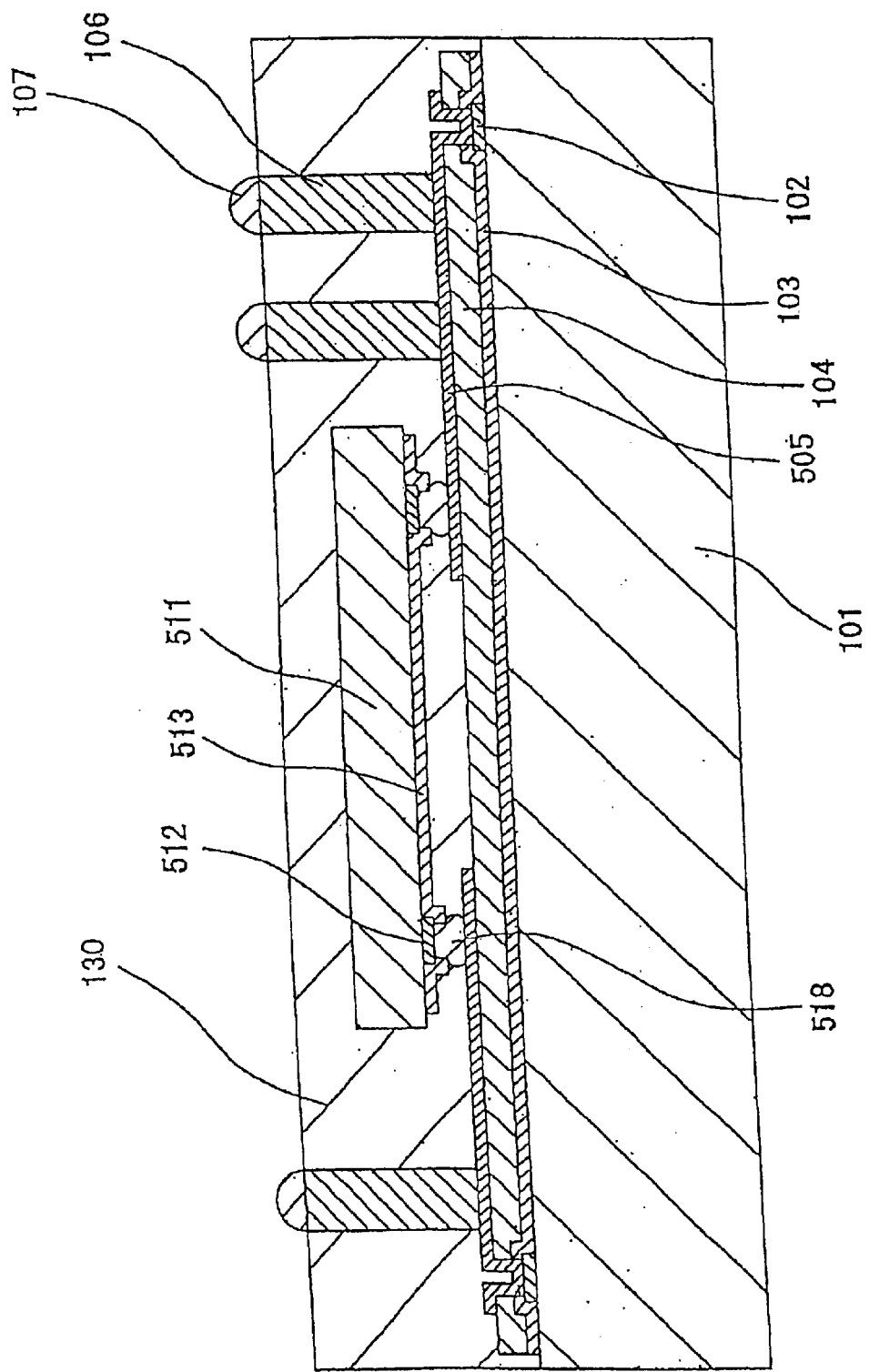
FIG. 5 shows a cross sectional view of a semiconductor device of a fifth embodiment of the invention.

FIG. 5 shows a cross sectional view of the semiconductor device of the fifth embodiment. The main surface of the second semiconductor device 511 faces the main surface of the first semiconductor device 101 in this embodiment.

A plurality of pads 512 and a protecting layer 513 is formed on the main surface of the second semiconductor chip 511. The pads 512 are connected to an inner circuit of the semiconductor chip 511. The protecting layer 513 protects the main surface of the semiconductor chip 511, and has a plurality of holes at the portion corresponding to the pads 512. Electrodes 518 (for example, solder bump, conductive resin, etc . . . ) are formed on the pads 512. The electrodes 518 are connected to the interconnections 505, which are formed over the first semiconductor chip 101, and electrically connected to the pads 102.

A plurality of semiconductor chips are thus electrically connected to each other in a package. The interconnections on the second semiconductor chip, such as interconnection 115 in the first embodiment, do not have to be formed. Therefore, a single protecting layer is enough to protect the main surface of the second semiconductor device. The process to fabricate a second semiconductor chip is thus simplified.

Figure 6:
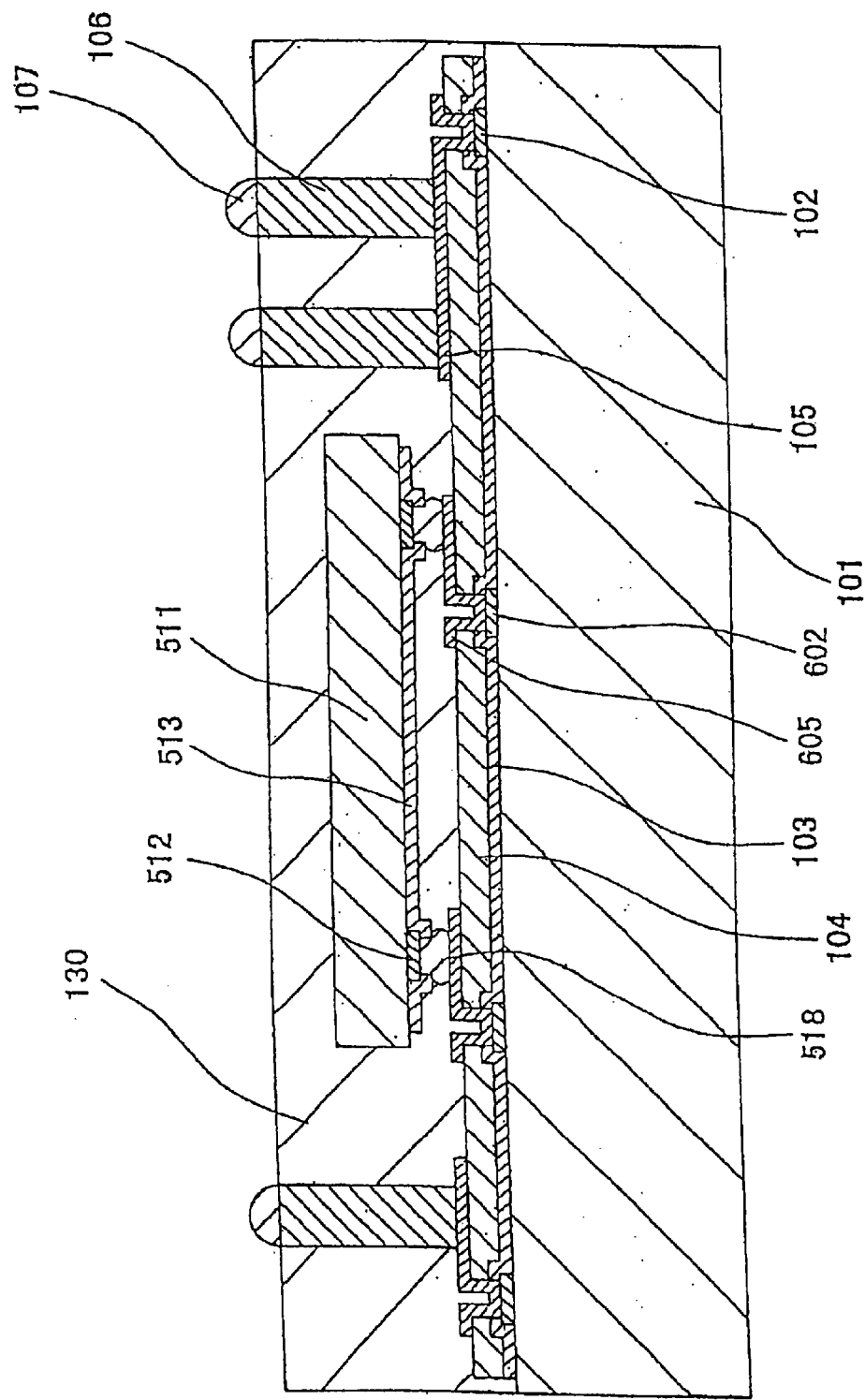
FIG. 6 shows a cross sectional view of a semiconductor device of a sixth embodiment of the invention.

FIG. 6 shows a cross sectional view of the semiconductor device of the sixth embodiment. The main surface of the second semiconductor device 511 faces the main surface of the first semiconductor device 101 in this embodiment. A first plurality of pads 102 and a second plurality of pads 602 are formed on the first semiconductor device 101. First interconnections 105 and second interconnections 605 are formed on the first protecting layer 104. The second pads 602 are electrically connected to an inner circuit of the first semiconductor chip 101. The protecting layers 103, 104 have a plurality of holes at the portion corresponding to the pads 102 and 602. The first interconnections 105 electrically connect the first pads 102 on the first semiconductor device to an outer circuit or an outer board. The second interconnections 605 electrically connect the second pads 602 on the first semiconductor chip 101 to the pads 512 on the second semiconductor chip 511 via electrodes 518.

A plurality of semiconductor chips are thus electrically connected to each other in a package in this embodiment. In case that a plurality of semiconductor chips are fixed on the first semiconductor chip (supporting substrate), it is possible to connect one fixed semiconductor chip to another fixed semiconductor chip via second interconnections 605 in this embodiment. The flexibility of the pattern of the interconnection is thus improved.

Figure 7:
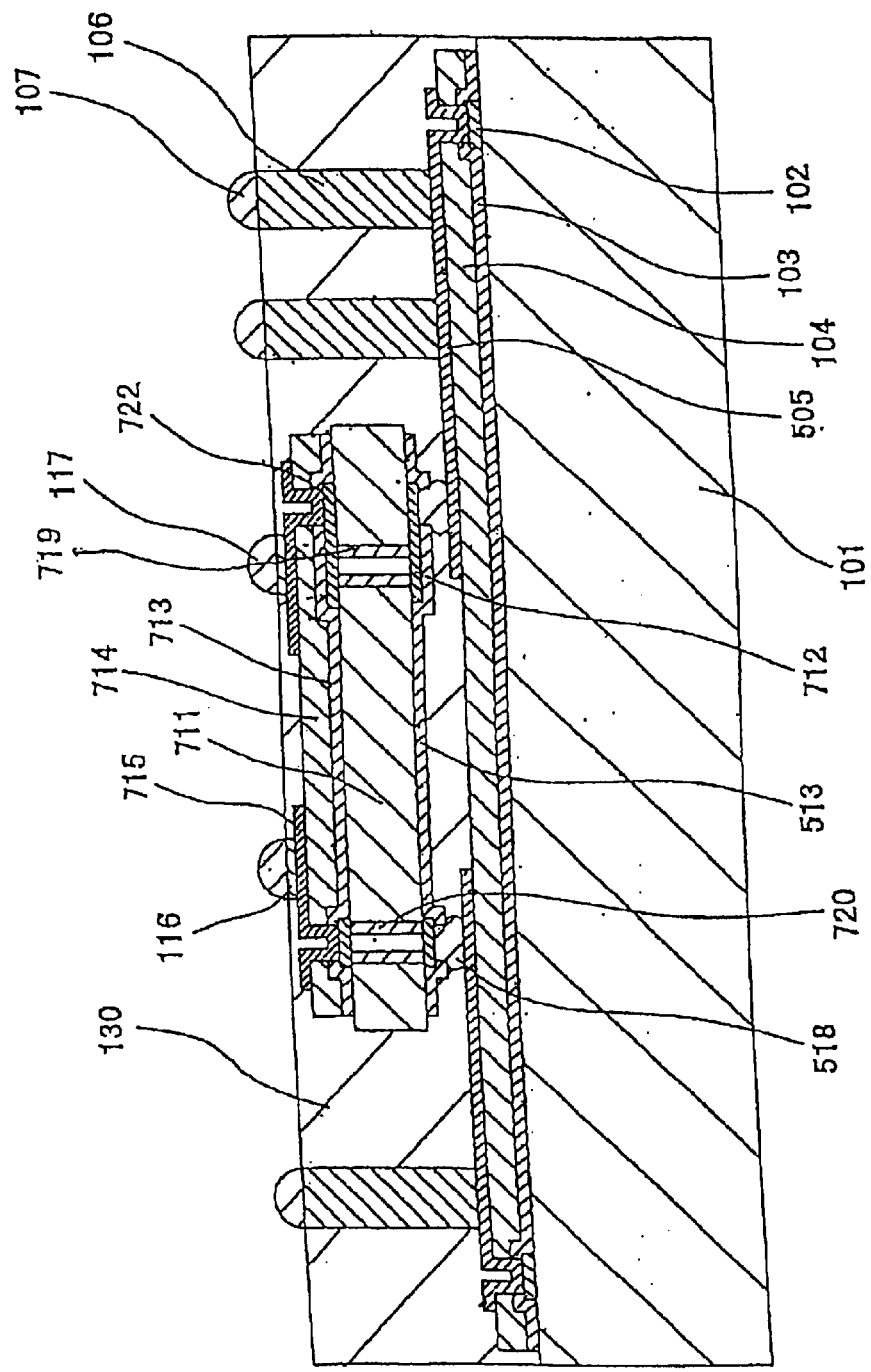
FIG. 7 shows a cross sectional view of a semiconductor device of a seventh embodiment of the invention.

FIG. 7 shows a cross sectional view of the semiconductor device of the seventh embodiment. The main surface of the second semiconductor chip 711 faces the main surface of the first semiconductor chip 101 in this embodiment.

A plurality of pads 712 and a protecting layer 513 are formed on the main surface of the second semiconductor chip 711. The pads 712 are connected to an inner circuit of the semiconductor chip 711. The protecting layer 513 protects the main surface of the semiconductor chip 711, and has a plurality of holes at the portions corresponding to the pads 712. Electrodes 518 (for example, solder bump, conductive resin, etc . . . ) are formed on the pads 712. The electrodes 518 are connected to the interconnections 505, which are formed over the first semiconductor chip 101, and electrically connected to the pads 102.

The second semiconductor chip further includes via-holes 719. The via-holes 719 penetrate the semiconductor chip 711. A conductive material 720 is formed in the via-holes 719. This conductive material 720 is isolated from the substrate of the second semiconductor chip 711, and electrically connected to the pads 712 on the second semiconductor chip.

Back electrodes 722 and protecting layers 713, 714 are formed on the back surface of the second semiconductor chip 711. The back electrodes 722 are electrically connected to the conductive material 720. The protecting layers 713 and 714 protect the back surface of the semiconductor chip 711, and have a plurality of holes at the portions corresponding to the back electrodes 722. Back interconnections 715 are formed on the protecting layer 714 over the back surface of the second semiconductor chip 712, and connected to the conductive material 720 via back electrodes 722. Conductive posts 116 are formed on the back interconnections 722. Connecting electrodes 117 are formed on the conductive posts.

A signal from the second semiconductor device can thus be directly connected to the outside of the semiconductor device via back electrodes in this embodiment.

Figure 11:
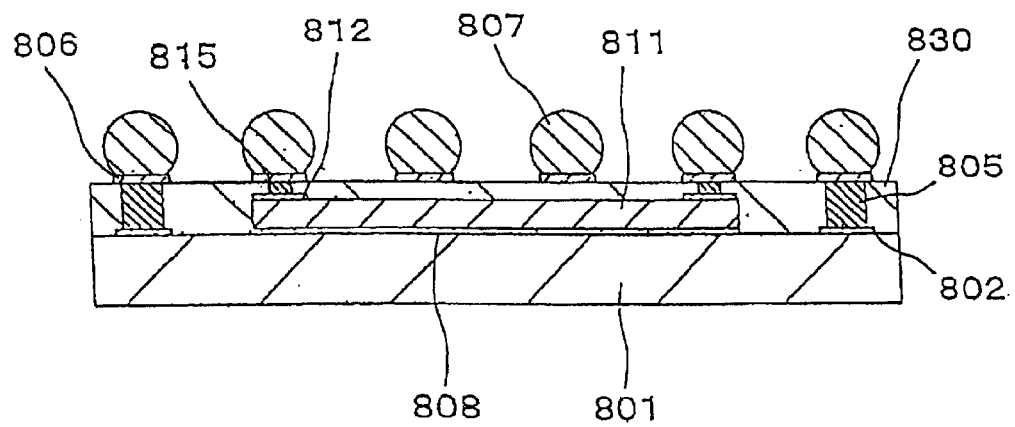
FIG. 11 shows a cross sectional view of a semiconductor device of an embodiment of the invention.

FIG. 11 shows a concrete example of a further embodiment of the invention. This package has two semiconductor chips. The second semiconductor chip 811 is fixed over the first semiconductor chip 801, which is a supporting substrate. The chip size of the first semiconductor chip 801 is the same as the size of the package.

Aluminum pads 802 are formed on the first semiconductor chip 801. The aluminum pads 802 are connected to an inner circuit of the first semiconductor chip 801. Copper posts 805 are formed on the aluminum pads 802, and electrically connected to the aluminum pads 802. An adhesive tape 808 is formed on the main surface of the first semiconductor chip 801. The second semiconductor chip 811 is fixed on the adhesive tape 808.

The second semiconductor chip 811 is a different chip from the first semiconductor chip 801, and is smaller than the first semiconductor chip 801. The thickness of the second semiconductor chip 811 is thin enough for packaging in the package. Aluminum pads 812 are formed on the main surface of the second semiconductor chip 811. The aluminum pads 812 are connected to an inner circuit of the semiconductor chip 811. Gold bumps 815 are formed on the aluminum pads 812. Resin 830 covers all main surfaces of the semiconductor chips. A plurality of interconnections 806 are formed on predetermined portions of the resin 830, copper posts 805, and gold bumps 815. Solder bumps 807 are formed on the interconnections.

The inner circuit of the first semiconductor chip 801 is electrically connected to an outer substrate via aluminum pads 802, copper posts 805, interconnections 806, and solder bumps 807. The inner circuit of the second semiconductor chip 811 is electrically connected to an outer substrate via aluminum pads 812, gold bumps 815, interconnections 806, and solder bumps 807. Interconnections 806 can be extended to connect the first semiconductor chip 801 to the second semiconductor chip 811. Therefore, the same effect as described in the first embodiment is obtained.

FIG. 15 shows a method for manufacturing the semiconductor device according to an embodiment of the invention. In general, the method is described using the example above. The aluminum pads 802 are formed on the first semiconductor chip 801. The aluminum pads 812 and the gold bumps 815 are formed on the second semiconductor chip 811. The first semiconductor chip 801 is not separated individually in this embodiment. A semiconductor wafer 881 as illustrated in FIG. 15(a) is cut into a plurality of first semiconductor chips 801.

In greater detail, aluminum pads 802 are formed on semiconductor wafer 881, as shown in FIG. 15(a). Copper posts 805 are formed on the aluminum pads 802 as shown in FIG. 15(b). The method for forming the copper posts is described below. A metal layer is formed on the whole surface of the semiconductor wafer 881. A resist is formed on the metal layer. A patterning of resist is performed using a lithography technique. Copper is plated on the predetermined portions of the metal layer. The resist is removed. The metal layer except for the predetermined portions is removed.

Then, the second semiconductor chips 811 with aluminum pads 812 and gold bumps formed thereon, are fixed over the semiconductor wafer 881 using adhesive layer 808 as shown in FIG. 15(c). Resin 830 is molded on the whole surface of the semiconductor wafer 881 as shown in FIG. 15(d). Copper posts 805 and gold bumps 815 are covered with resin is this situation. The top surface of the resin is polished until the copper posts 805 and the gold bumps 815 are exposed.

A plurality of interconnections 806 are formed on predetermined portions of the resin 830, copper posts 805, and gold bumps 815 as shown in FIG. 15(f). The method for forming the interconnections is described below. A metal layer is formed on the whole surface of the resin. A resist is formed on the metal layer. A patterning of resist is performed using a lithography technique. Copper is plated on the predetermined portion of the metal layer. The resist is removed. The metal layer except for the predetermined portion is removed. Then, tin or gold is plated on the copper.

Solder bumps 807 are thus formed on interconnections 806 as shown in FIG. 15(g). Semiconductor wafer 881 is diced to provide semiconductor devices separated individually including first semiconductor chips 801 as shown in FIG. 15(h).

Figure 12:
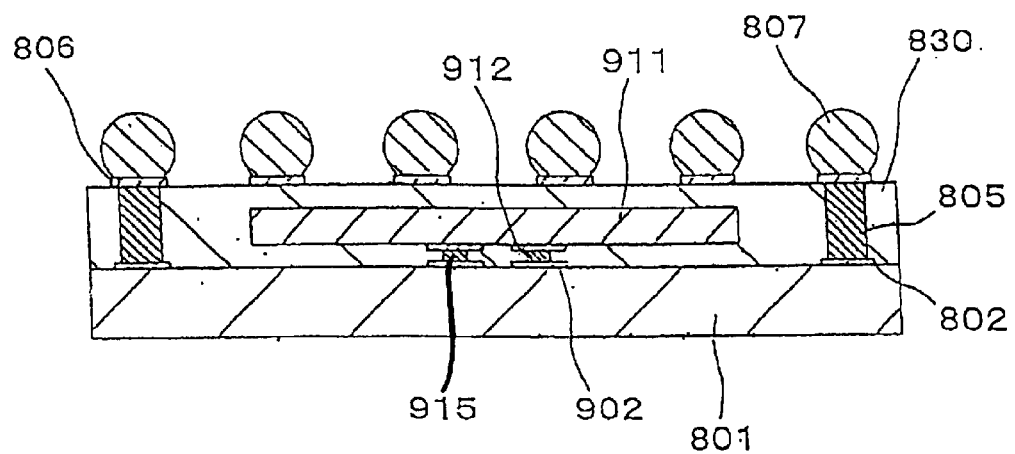
FIG. 12 shows another cross sectional view of a semiconductor device of an embodiment of invention.

FIG. 12 shows an example of a further embodiment of the invention. The second semiconductor chip 911 is fixed over the first semiconductor chip 801, which is a supporting substrate. The main surface of the second semiconductor chip 911 faces the main surface of the first semiconductor chip 801 in this example. The chip size of the first semiconductor chip 801, which is a supporting substrate, is the same as the size of the package.

A first plurality of pads 802 and second plurality of pads 902 are formed on the first semiconductor chip 801. Aluminum pads 912 are formed in the main surface of the second semiconductor chip 911. Gold bumps 915 are formed between the aluminum pads 902 and the aluminum pads 912. The aluminum pads 902 are electrically connected to the aluminum pads 912 via the gold bumps 915.

The aluminum pads 802 and 902 are connected to an inner circuit of the first semiconductor chip 801. The aluminum pads 912 are connected to an inner circuit of the second semiconductor chip 911. The first semiconductor chip 801 is electrically connected to the second semiconductor chip 911 in a package. If the second semiconductor chip 911 has to be connected to the outer substrate, the second semiconductor chip can be connected to the outer substrate via first semiconductor chip 801, copper posts 805, interconnections 806, and solder bumps 807. The adhesive tape is not used in this example, therefore, the cost for manufacturing the semiconductor device becomes cheap.

FIG. 16 shows a method for manufacturing a semiconductor device of an embodiment of the invention. The method is described about the example above. In general, the aluminum pads 802 and 902 are formed on the first semiconductor chip 801. The aluminum pads 912 and the gold bumps 915 are formed on the second semiconductor chip 911. The first semiconductor chip 801 is not separated individually in this embodiment. A semiconductor wafer 881 as illustrated in FIG. 16(a) is cut into a plurality of first semiconductor chips 801.

In greater detail, aluminum pads 802 are formed on semiconductor wafer 881, as shown in FIG. 16(a). Copper posts 805 are formed on the aluminum pads 802 as shown in FIG. 16(b). The method for forming the copper posts is described below. A metal layer is formed on the whole surface of the semiconductor wafer 881. A resist is formed on the metal layer. A patterning of resist is performed using a lithography technique. Copper is plated on the predetermined portions of the metal layer. The resist is removed. Then, the metal layer except for the predetermined portions is removed.

Then, the second semiconductor chips 811 with aluminum pads 912 and gold bumps 915 formed thereon, are fixed over the semiconductor wafer 881 as shown in FIG. 16(c). The main surface of the second semiconductor chips face the main surface of the first semiconductor chip, and the gold bump 915 are connected to the aluminum pads 902 on the semiconductor wafer 881. Resin 830 is molded on the whole surface of the semiconductor wafer 881 as shown in FIG. 16(d). The top surface of the resin is shaved until the copper posts 805 are exposed as shown in FIG. 16(e).

A plurality of interconnections 806 are formed on predetermined portions of the resin 830 and copper posts 805 as shown in FIG. 16(f). The method for forming the interconnections is described below. A metal layer is formed on the whole surface of the resin. A resist is formed on the metal layer. A patterning of resist is performed using a lithography technique. Copper is plated on the predetermined portions of the metal layer. The resist is removed. The metal layer except for the predetermined portion is removed. Then, tin or gold is plated on the copper.

Solder bumps 807 are thus formed on interconnections 806 as shown in FIG. 16(g). Semiconductor wafer 881 is diced to provide semiconductor devices separated individually as including first semiconductor chips 801 as shown in FIG. 16(h).

Figure 13:
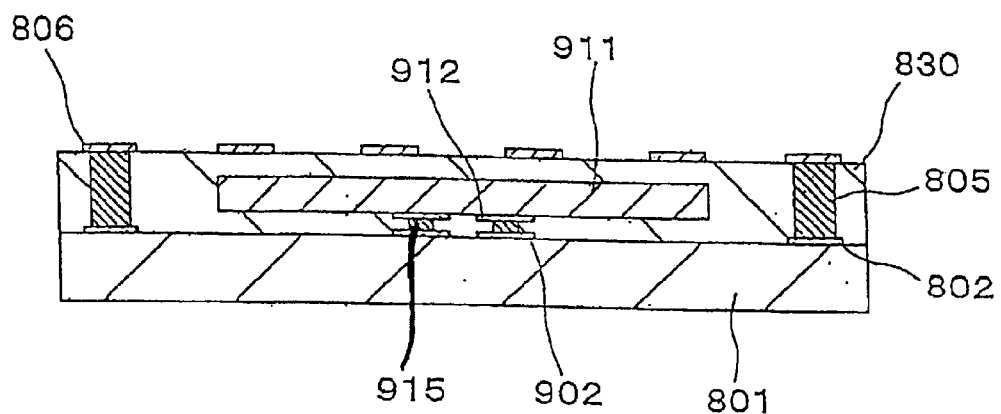
FIG. 13 shows an example of a semiconductor device of an embodiment of invention.

FIG. 13 shows another example of the invention. This example is almost the same as the described example above with respect to FIG. 12. However, solder bumps 807 are removed in this example. Solder bumps 807 can be removed if there is need for the solder bumps.

Figure 14:
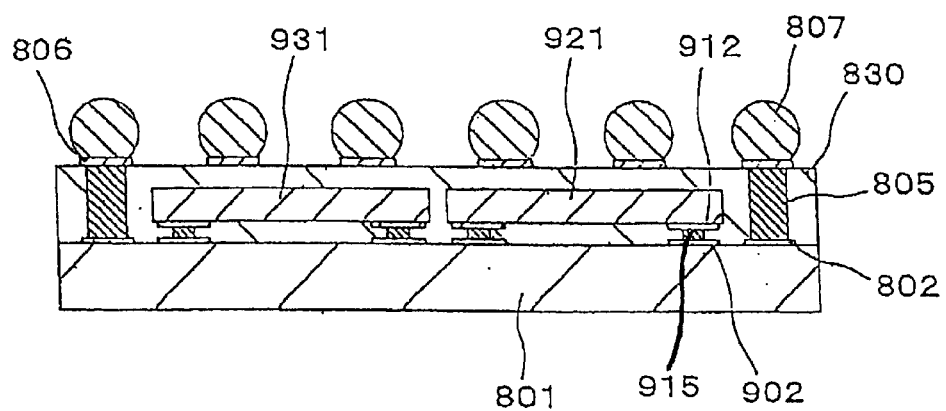
FIG. 14 shows another example of a semiconductor device of an embodiment of invention.

FIG. 14 shows another example of the invention. This example is almost the same as the example above. This example is almost the same as the described example above with respect to FIG. 12. However, two semiconductor chips 921 and 931 are fixed on the first semiconductor chip in this example. More than two semiconductor chips can be fixed on the first semiconductor chip according to necessity.

One skilled in the art will appreciate that the present invention can be practiced by other than the described embodiments, which are presented for purposes of illustration and not limitation.

What is claimed is:

1. A semiconductor device comprising:
   a first semiconductor chip having a main surface, the main surface including a plurality of pads;
   an insulating layer formed on the main surface of said first semiconductor chip;
   a second semiconductor chip having a plurality of pads, said second semiconductor chip being fixed on said insulating layer over the main surface of said first semiconductor chip;
   a plurality of conductive posts formed over the main surface of said first semiconductor chip on said insulating layer and over a main surface of said second semiconductor chip, said plurality of conductive posts being electrically connected to the plurality of pads on said first semiconductor chip and the plurality of pads on said second semiconductor chip; and
   a resin covering said insulating layer and the main surfaces of said first and second semiconductor chips, said resin partially covering said plurality of conductive posts.

2. The semiconductor device as claimed in claim 1, further comprising:
   a conductive layer formed under a back surface of said second semiconductor chip, said conductive layer electrically connecting the back surface of said second semiconductor chip to one of said plurality of conductive posts.

3. The semiconductor device as claimed in claim 1, further comprising:
   an insulating side wall structure formed on a side surface of said second semiconductor chip; and
   a conductive layer formed over said insulating side wall structure, electrically connecting one of said plurality of pads formed on said first semiconductor chip to one of said plurality of pads formed on said second semiconductor chip.

4. The semiconductor device as claimed in claim 1, further comprising interconnections formed on said insulating layer that electrically connect said plurality of conductive posts to the plurality of pads on said first semiconductor chip.

5. The semiconductor device as claimed in claim 4, wherein the interconnections are formed through said insulating layer to electrically contact the plurality of pads on said first semiconductor chip.

6. The semiconductor device as claimed in claim 1, wherein said second semiconductor chip is fixed on said insulating layer by a die bonding material.

7. The semiconductor device as claimed in claim 1, wherein said insulating layer comprises a polymide layer on a silicon oxide layer.

8. A semiconductor device comprising:

a first semiconductor chip having a main surface, the main surface including a plurality of pads;

a second semiconductor chip having a plurality of pads, said second semiconductor chip being fixed over the main surface of said first semiconductor chip;

an insulating layer formed on the main surface of said first semiconductor chip, said insulating layer having a thickness greater than a thickness of said second semiconductor chip and having a concave portion, said second semiconductor chip being set in the concave portion;

a plurality of conductive posts formed over the main surface of said first semiconductor chip on said insulating layer and over a main surface of said second semiconductor chip, said plurality of conductive posts being electrically connected to the plurality of pads on said first semiconductor chip and the plurality of pads on said second semiconductor chip; and a resin covering said insulating layer and the main surfaces of said first and second semiconductor chips, said resin partially covering said plurality of conductive posts.

9. The semiconductor device as claimed in claim 8, further comprising interconnections formed on said insulating layer that electrically connect said plurality of conductive posts to the plurality of pads on said first semiconductor chip.

10. The semiconductor device as claimed in claim 9, wherein the interconnections are formed through said insulating layer to electrically contact the plurality of pads on said first semiconductor chip.

11. The semiconductor device as claimed in claim 8, wherein said second semiconductor chip is fixed on said insulating layer by a die bonding material.

12. The semiconductor device as claimed in claim 8, wherein said insulating layer comprises a polymide layer on a silicon oxide layer.

13. A semiconductor device comprising:

a first semiconductor chip having a main surface, the main surface including a plurality of pads;

a second semiconductor chip having a main surface including a plurality of pads, said second semiconductor chip being fixed over the main surface of said first semiconductor chip, the main surface of said first semiconductor chip facing the main surface of said second semiconductor chip;

a plurality of conductive posts formed over the main surface of said first semiconductor chip and electrically connected to the plurality of pads on said first semiconductor chip;

a plurality of conductive electrodes formed on the plurality of pads of said second semiconductor chip and electrically connected to the plurality of pads on said first semiconductor chip;

a resin covering the main surface of said first semiconductor chip and a back surface of said second semiconductor chip, said resin partially covering said plurality of conductive posts; and an insulating layer formed on the main surface of a said first semiconductor chip, said second semiconductor chip and said plurality of conductive posts being formed on said insulating layer over the main surface of said first semiconductor chip.

14. The semiconductor device as claimed in claim 13, further comprising:

a via-hole formed through said second semiconductor chip;

a conductive material formed in said via-hole, said conductive material electrically connected to the plurality of pads on said second semiconductor chip; and a plurality of interconnections formed over the back surface of said second semiconductor chip, at least one of said plurality of interconnections electrically connected to said conductive material in said via-hole.

15. The semiconductor device as claimed in claim 13, further comprising:

a conductive layer formed on said insulating layer over said first semiconductor chip, electrically connecting one of said plurality of pads formed on said first semiconductor chip to one of said plurality of pads formed on said second semiconductor chip.

16. The semiconductor device as claimed in claim 13, further comprising interconnections formed on said insulating layer that electrically connect said plurality of conductive posts to the plurality of pads on said first semiconductor chip.

17. The semiconductor device as claimed in claim 16, wherein the interconnections are formed through said insulating layer to electrically contact the plurality of pads on said first semiconductor chip.

18. The semiconductor device as claimed in claim 13, wherein said insulating layer comprises a polymide layer on a silicon oxide layer.

* * * * *